(12) United States Patent
Ting et al.

(10) Patent No.: US 10,170,420 B2
(45) Date of Patent: *Jan. 1, 2019

(54) PATTERNING APPROACH FOR IMPROVED VIA LANDING PROFILE

(71) Applicant: Taiwan Semiconductor Manufacturing Co., Ltd., Hsin-Chu (TW)

(72) Inventors: Chih-Yuan Ting, Taipei (TW); Chung-Wen Wu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/496,491

(22) Filed: Apr. 25, 2017

(65) Prior Publication Data

US 2017/0229397 A1    Aug. 10, 2017

Related U.S. Application Data

(60) Continuation of application No. 15/088,292, filed on Apr. 1, 2016, now Pat. No. 9,640,435, which is a (Continued)

(51) Int. Cl.
  *H01L 23/48* (2006.01)
  *H01L 23/52* (2006.01)
  (Continued)

(52) U.S. Cl.
  CPC ...... *H01L 23/5283* (2013.01); *H01L 21/7681* (2013.01); *H01L 21/7684* (2013.01); (Continued)

(58) Field of Classification Search
  CPC ..... H01L 21/02063; H01L 2224/73265; H01L 23/5226
  See application file for complete search history.

(56) References Cited

U.S. PATENT DOCUMENTS 5,756,396 A * 5/1998 Lee .................. H01L 21/76838
                                                           257/E21.582
5,899,738 A    5/1999 Wu et al.
(Continued)

FOREIGN PATENT DOCUMENTS

| KR | 100165454 B1 | 9/1998 |
| KR | 1020030002529 A | 1/2003 |
| KR | 101005737 B1 | 1/2011 |

OTHER PUBLICATIONS

Notice of Allowance of U.S. Appl. No. 13/794,999 dated Dec. 7, 2015.
(Continued)

*Primary Examiner* — Jaehwan Oh
*Assistant Examiner* — John M Parker
(74) *Attorney, Agent, or Firm* — Eschweiler & Potashnik, LLC

(57) ABSTRACT

The present disclosure is directed to a semiconductor structure that includes a semiconductor substrate. A first interconnect layer is disposed over the semiconductor substrate. The first interconnect layer includes a first dielectric material having a conductive body embedded therein. The conductive body includes a first sidewall, a second sidewall, and a bottom surface. A spacer element has a sidewall which contacts the first sidewall of the conductive body and which contacts the bottom surface of the conductive body. A second interconnect layer overlies the first interconnect layer and includes a second dielectric material with at least one via therein. The at least one via is filled with a conductive material which is electrically coupled to the conductive body of the first interconnect layer.

20 Claims, 6 Drawing Sheets

Related U.S. Application Data division of application No. 13/794,999, filed on Mar. 12, 2013, now Pat. No. 9,312,222.

(51) Int. Cl.
  *H01L 29/40* (2006.01)
  *H01L 23/528* (2006.01)
  *H01L 23/522* (2006.01)
  *H01L 23/532* (2006.01)
  *H01L 21/768* (2006.01)

(52) U.S. Cl.
  CPC .. *H01L 21/76802* (2013.01); *H01L 21/76816* (2013.01); *H01L 21/76831* (2013.01); *H01L 21/76843* (2013.01); *H01L 21/76846* (2013.01); *H01L 21/76883* (2013.01); *H01L 21/76897* (2013.01); *H01L 23/5226* (2013.01); *H01L 23/5329* (2013.01); *H01L 23/53295* (2013.01); *H01L 2924/0002* (2013.01)

(56) References Cited

U.S. PATENT DOCUMENTS

| | | |
|---|---|---|
| 5,942,801 A | 8/1999 | Tran |
| 6,136,695 A | 10/2000 | Lee et al. |
| 6,245,665 B1 | 6/2001 | Yokoyama |
| 6,476,488 B1 | 11/2002 | Jeng et al. |
| 6,787,911 B1 | 9/2004 | Zhao et al. |
| 6,960,529 B1 * | 11/2005 | Nelson ............ H01L 21/76852 438/622 |
| 7,838,428 B2 * | 11/2010 | Chen .................. H01L 21/3105 257/E23.145 |
| 2003/0038371 A1 | 2/2003 | Hsue et al. |
| 2004/0238867 A1 | 12/2004 | Park |
| 2004/0253811 A1 | 12/2004 | Lee et al. |
| 2006/0131630 A1 | 6/2006 | Sun et al. |
| 2008/0073748 A1 | 3/2008 | Bielefeld et al. |

OTHER PUBLICATIONS

Final Office Action for U.S. Appl. No. 13/794,999 dated Sep. 25, 2015.
Non-Final Office Action for U.S. Appl. No. 13/794,999 dated Feb. 18, 2015.
Non-Final Office Action dated Aug. 15, 2016 for U.S. Appl. No. 15/088,292.
Notice of Allowance dated Dec. 19, 2016 for U.S. Appl. No. 15/088,292.

\* cited by examiner

PATTERNING APPROACH FOR IMPROVED VIA LANDING PROFILE

REFERENCE TO RELATED APPLICATIONS

This application is a Continuation of U.S. application Ser. No. 15/088,292 filed on Apr. 1, 2016, which is a Divisional of U.S. application Ser. No. 13/794,999 filed on Mar. 12, 2013 (now U.S. Pat. No. 9,312,222 issued on Apr. 12, 2016). The contents of the above-identified applications are hereby incorporated by reference in their entirety.

BACKGROUND

In semiconductor devices, it is known to etch through a dielectric material to make electrical contact to a conductive or semiconductor feature which is covered by the dielectric material. Electrical contact may be made by way of a via, for example, or by formation of a conductor formed by a damascene method.

DETAILED DESCRIPTION

Figure 1:
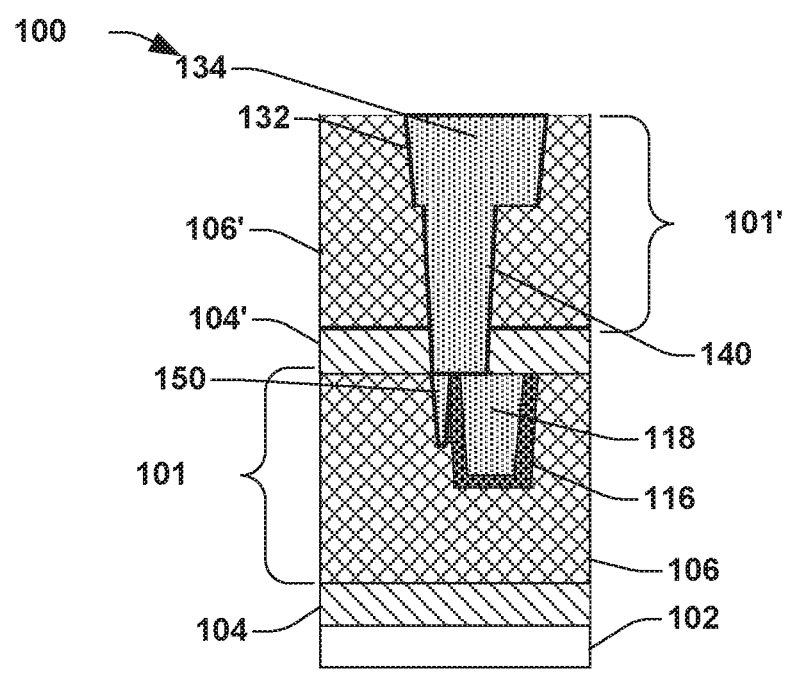
FIG. 1 is a partial cross section view illustrating a semiconductor structure formed in accordance with a conventional process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor devices are manufactured or fabricated on semiconductor wafers using a number of different processing steps to create transistor and interconnection elements. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuits of the semiconductor devices, and circuits external to the semiconductor device.

In forming the interconnection elements the semiconductor wafer may undergo, for example, masking, etching, and deposition processes to form the desired electronic circuitry of the semiconductor devices. In particular, multiple masking and etching steps can be performed to form a pattern of recessed areas in a dielectric layer, such as a low-k dielectric layer, on a semiconductor wafer that serves as trenches and vias for the interconnections. A deposition process may then be performed to deposit a metal layer over the semiconductor wafer thereby depositing metal both in the trenches and vias and also on the non-recessed areas of the semiconductor wafer. To isolate the interconnections, such as patterned trenches and vias, the metal deposited on the non-recessed areas of the semiconductor wafer is removed.

The ongoing reduction of the feature sizes and of the integrated circuits gives rise to the general problem that subsequent metallization levels have to be aligned ever more precisely with respect to one another. However, a certain intrinsic misalignment is inevitable when one level is being lithographically mapped onto another. Therefore, the design has to incorporate certain tolerances which ensure that the contacts of one via level can land reliably on the respective interconnects of the metallization level below it.

A semiconductor substrate having a via on a metallization structure is shown, for example, in FIG. 1. In FIG. 1, a substrate 102 having a first etch stop layer 104 is provided. Overlying etch stop layer 104 is a first interconnect layer 101 including a metal body 118, for example, a copper metal body, embedded in a first dielectric layer 106. Encompassing bottom surface and sidewalls of metal body 118 is a barrier layer 116. The first interconnect layer 101 is separated from a second interconnect layer 101' by a second etch stop layer 104'. The second interconnect layer 101' includes a second dielectric material 106' having a via opening 140 filled with a conductive material 134. A second barrier layer 132 separates the conductive material 134 from the second dielectric material 106'.

As critical dimensions of semiconductor integrated circuit devices shrink, the misalignment between the via opening 140 and the copper metal body 118 becomes more pronounced. When misalignment occurs, the dielectric layer 106 that encapsulates the landing metal body 118 is etched, resulting in a via substructure defect 150 next to the metal body 118. Such a defect results in a degradation of the overall wiring reliability as well as the strength of the via to wire connection.

In view of the problems associated with current methods for interconnect structures, there is a continued need for developing a new and improved integration scheme that improves the reliability and strength of the via-to-wire connection, without introducing damaged regions into the dielectric material.

Accordingly, the present disclosure is directed to a semiconductor structure and methods of fabrication of a semiconductor structure. The methods provide a process for defining an interconnect structure that eliminates conventional gap-fill metallization issues, as well as providing a better via landing profile when a via is not perfectly aligned with the metal body to which it is electrically coupled.

Figure 2A:
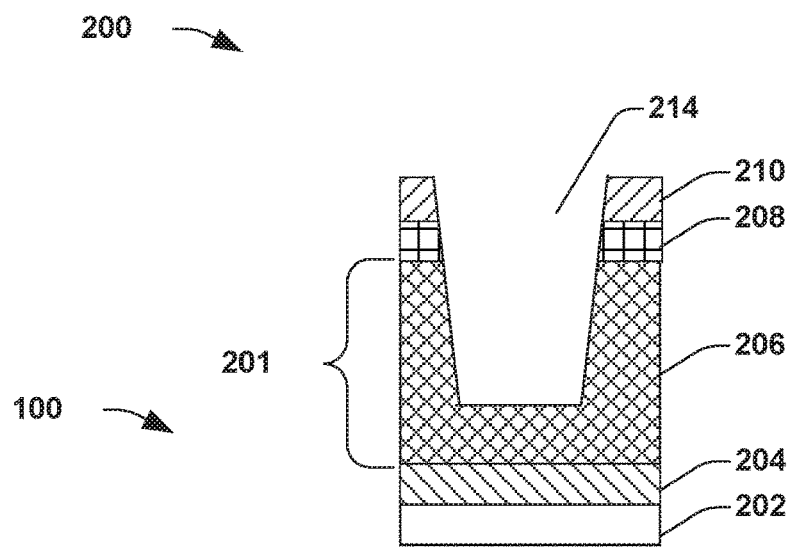
FIGS. 2A-2J are partial cross sectional views illustrating steps of one embodiment of forming a semiconductor device in accordance with the disclosure.

FIGS. 2A-2J illustrate a plurality of partial cross section diagrams illustrating one embodiment of a method of forming a semiconductor structure at stages in the manufacturing process according to the disclosure. Referring to FIG. 2A, there is provided a first interconnect layer 201 on a semiconductor substrate 202 in which an opening 214 has been formed. Substrate 202 is understood to include a semiconductor wafer or substrate, comprised of a semiconducting material such as silicon or germanium, or a silicon on insulator structure (SOI). Semiconductor structure can further include one or more conductive layers (such as metal or silicon) and/or insulating layers, and one or more active or passive devices formed in or over the substrate, or the like, for example, a display substrate such as a liquid crystal display (LCD), plasma display, electro-luminescence (EL) lamp display, or a light emitting diode (LED) substrate.

First interconnect layer 201 includes a first etch stop layer 204. Etch stop layer 204 comprises, in one embodiment, dielectric etch stop materials, for example, $SiO_2$, SiN, SiC, SiCN. In another embodiment, the etch stop material may include AlN. The etch stop layer may be deposited employing methods including but to limited to chemical vapor deposition (CVD) methods, plasma enhanced chemical vapor deposition (PECVD) methods and physical vapor deposition (PVD) sputtering methods. In one embodiment, etch stop layer 204 thickness will be in a range of from about 10 angstroms to about 500 angstroms.

First interconnect layer 201 further includes a first dielectric layer 206 overlying first etch stop layer 204. The first dielectric layer 206 comprises, in one embodiment, a low k dielectric material having a dielectric constant of less than 3.0. The low-k dielectric includes dielectrics with k less than about 3. Such dielectrics include, for example, carbon-doped silicon dioxide, also referred to as organosilicate glass (OSG) and carbon-oxide. Low-k materials may also include borophosphosilicate glass (BPSG), borosilicate glass (BSG), and phosphosilicate glass (PSG), among others. The dielectric layer 206 may be formed using, for example, tetraethyl orthosilicate (TEOS), chemical vapor deposition (CVD), plasma enhanced CVD (PECVD), low pressure CVD (LP-CVD), or spin-on coating techniques. First dielectric layer may comprise a material such as SiCOH or $SiO_2$. The first dielectric layer 206 will have a thickness of from about 600 angstroms to about 3000 angstroms.

A capping layer 208 is formed overlying first dielectric layer 206. Capping layer 208 comprises combinations of carbon, silicon, nitrogen, and oxygen, such as silicon oxycarbide, silicon nitride, silicon oxynitride, and the like. The method of formation includes commonly used methods such as chemical vapor deposition (CVD), physical vapor deposition (PVD), spin-on (for spin-on glass), atomic layer deposition (ALD), and the like. The thickness of the capping layer is between about 50 angstroms and about 500 angstroms.

A hard mask layer 210 overlies capping layer 208. The hard mask layer 208 is used in a subsequent photolithographic process to form opening 214 in first dielectric layer 206. In some embodiments, the hard mask layer 210 comprises a material such as titanium nitride. The hard mask layer 210 will have a thickness of from about 100 angstroms to about 500 angstroms in one embodiment.

Figure 2B:
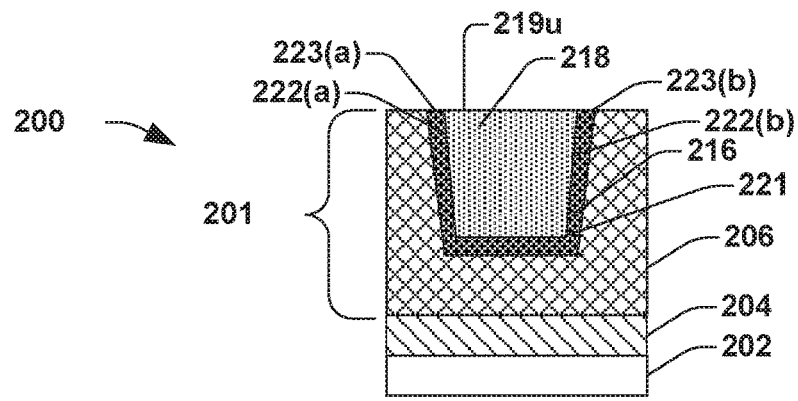

In FIG. 2B, a metal is deposited (not shown) to fill opening 214 in first dielectric layer 206 to form a metal body 218 embedded within dielectric layer 206. Metal body 218 is defined by a bottom surface 221 and opposing sidewalls 222(a), 222(b) having first and second edges 223(a), 223(b). In one embodiment, the metal body 218 can be formed from elements such as Al, W, Cu, Cu alloys, and the like. Metal body 218 can be formed using, for example, a plasma vapor deposition technique, among others. Metal body 218 can have a height, in one embodiment, of from about 300 angstroms to about 1500 angstroms.

Prior to filling of opening 214 with metal body 218, a first barrier layer 216 can be deposited to line opening 214 and encompass bottom surface 221 and opposing sidewalls 222(a), 222(b) of metal body 218. First barrier layer 216 may comprise, in one embodiment, a material such as Ta, TaN, Co, W, TiSiN, TaSiN, or combinations thereof. The first barrier layer 216 may be formed at a thickness of from about 15 A° to about 1500 A°. A chemical mechanical polishing (CMP) process (not shown) can then be performed to remove excess metal and expose an upper surface 219u of metal body 218, as illustrated in FIG. 2B.

Figure 2C:
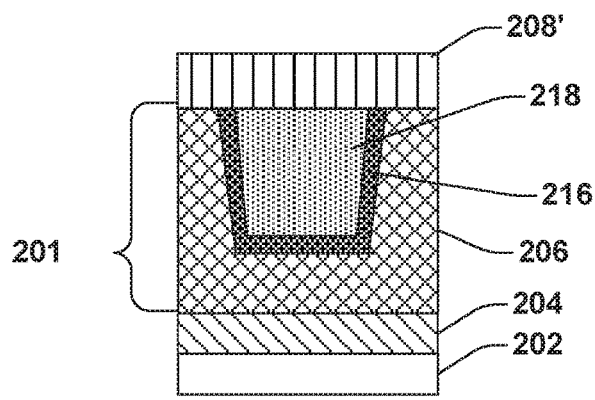
Figure 2D:
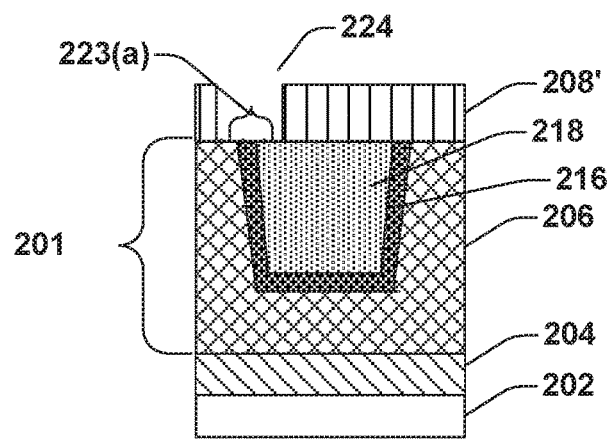
Figure 2E:
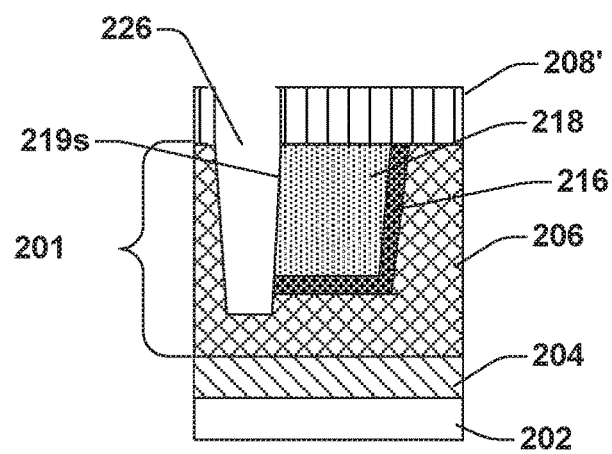
Figure 2F:
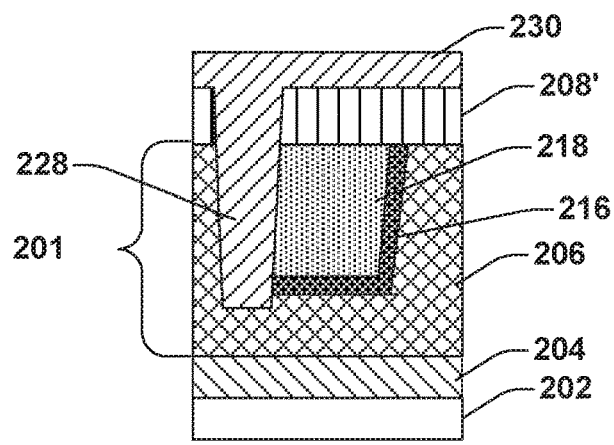

Following the CMP process, a second hard mask layer 208' is deposited overlying metal body 218 and first dielectric layer 206, as illustrated in FIG. 2C. Hard mask layer 208' is photolithographically patterned to provide an opening 224 therein, as illustrated in FIG. 2D. The opening 224 is positioned so as to be disposed over first edge 223(a) of metal body 218. An etch process (not shown) is then performed to etch through first dielectric layer 206 and a sidewall 222(a) of metal body 218, forming a second opening 226 therein, as illustrated in FIG. 2E. Second opening 226 is adjacent to metal body 218 and includes a sidewall 219s contiguous with the metal body 218

Figure 2G:
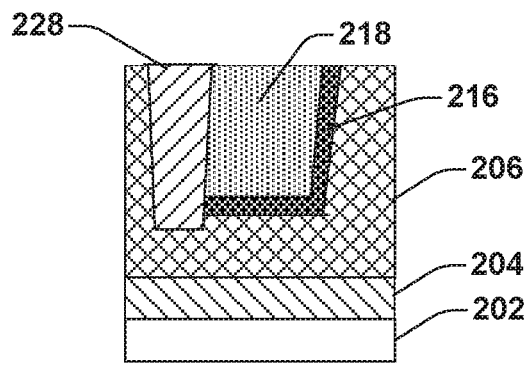

A spacer element 228 is then formed in FIG. 2G by deposition of a spacer material overlying hard mask layer 208' and filling second opening 226. Spacer material may comprise, in one embodiment, dielectric materials, for example, $SiO_2$, SiN, SiC, SiCN. In another embodiment, the spacer material may include AlN. In one embodiment, the spacer element 228 may be formed from the same material as the etch stop layer 204. In another embodiment, the spacer element 228 and the etch stop layer 204 may be formed from different materials. The spacer element 228 may be deposited, in one embodiment, by a method such as atomic layer deposition. Spacer element 228 may have a height, in one embodiment, of greater than or equal to 1500 A°. In one embodiment, the height of the spacer element will be greater than or equal to the height of the metal body 218. Following formation of spacer element 228, hard mask layer 208' and spacer material overlying hard mask layer 208' are removed, as by a CMP process (not shown) such that spacer element 228, metal body 218 and first barrier layer 216 each have an upper surface that is substantially coplanar, as illustrated in FIG. 2G.

Figure 2H:
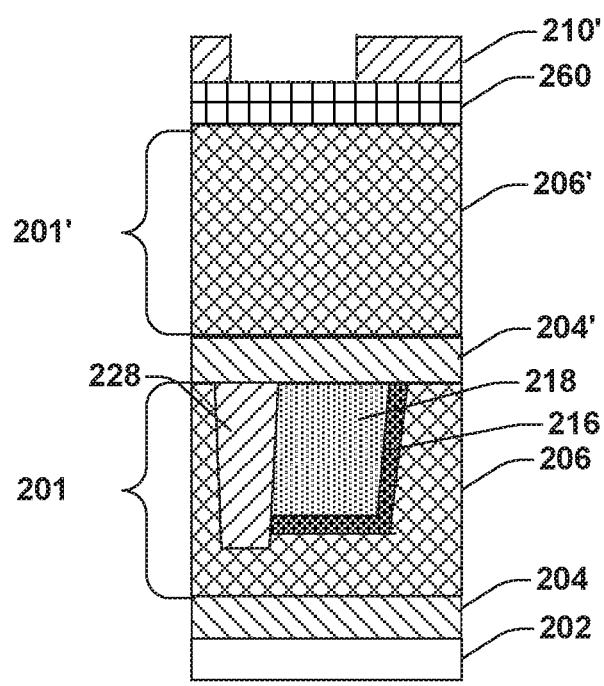

After formation of the first interconnect layer 201, a second etch step layer 204' is deposited overlying the first interconnect layer 201, as shown in FIG. 2H. Second etch stop layer 204' may comprise the same material as first etch stop layer 204. A second interconnect layer 201' may then be formed overlying first interconnect structure 201 by depositing a second dielectric material 206' over second etch stop layer 204'. The second dielectric material 206' may comprise the same or different materials as that of the first dielectric material 206. The processing techniques and thickness ranges for the first dielectric material 206 are applicable for the second dielectric material 206'.

A dielectric capping layer 260 is formed overlying the second interconnect layer 201', as shown in FIG. 2H. Dielectric capping layer 260 may be formed utilizing a conventional process, such as, for example, chemical vapor deposition (CVD), PECVD, and the like. The capping layer 260 may comprise any suitable dielectric capping material, such as SiC, $SiO_2$, SiN or SiCN. The capping layer 260 may be formed at a thickness of from about 50 angstroms to about 500 angstroms.

Figure 2I:
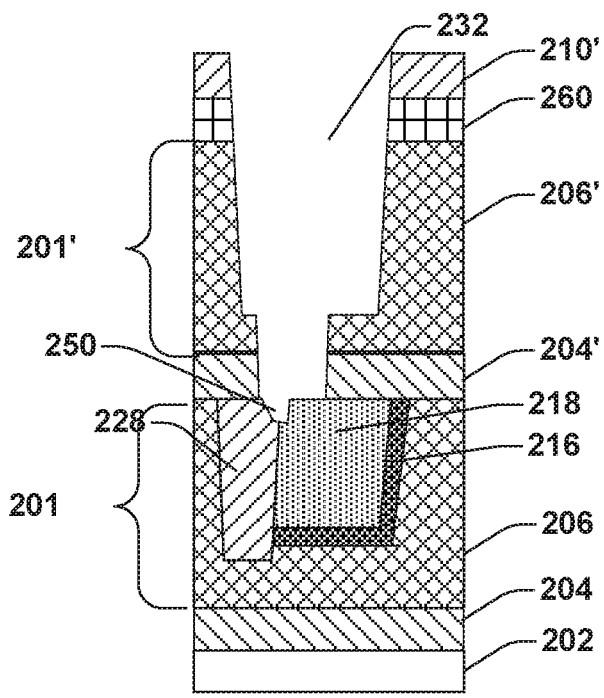

At least one opening such as a dual damascene trench and via structure 232 is formed in the second dielectric layer 206' utilizing conventional photolithographic techniques, as previously described. In one embodiment, the etching may comprise a dry etch such as reactive ion etching, ion beam etching, plasma etching, and the like. As illustrated in FIG. 2I, the etching process provides at least one dual damascene trench and via structure 232 in the second dielectric layer 206'. The at least one dual damascene trench and via structure 232 may comprise a via which is misaligned relative to an edge 223(a) of the metal body 218 and extends into a top surface of the spacer element 228 and the metal body 218 to form a via substructure defect 250. A portion of the misaligned via lands on the metal body 218, while other portions of the misaligned via are formed in the adjacent spacer element 228. As is illustrated, then, in comparison with FIG. 1, the semiconductor structure of FIG. 2I has a significantly reduced via substructure defect 250 in the dielectric material 206' of the first interconnect layer 201, while eliminating conventional gap-fill metallization issues.

Figure 2J:
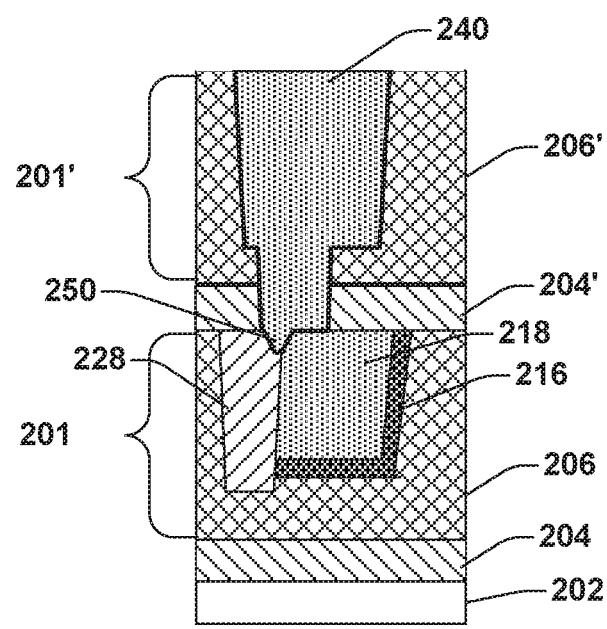

In FIG. 2J, a second barrier layer 242 is disposed between second dielectric material 206' and conductive material 240. Second barrier layer 242 may comprise the same material as first barrier layer 216, or a different material. The conductive material 240 is then deposited to fill the dual damascene trench and via structure 232 and electrically couple the conductive material 240 to the metal body 218 of the first interconnect layer 201. A CMP process may then be performed to planarize conductive material 240.

Figure 3:
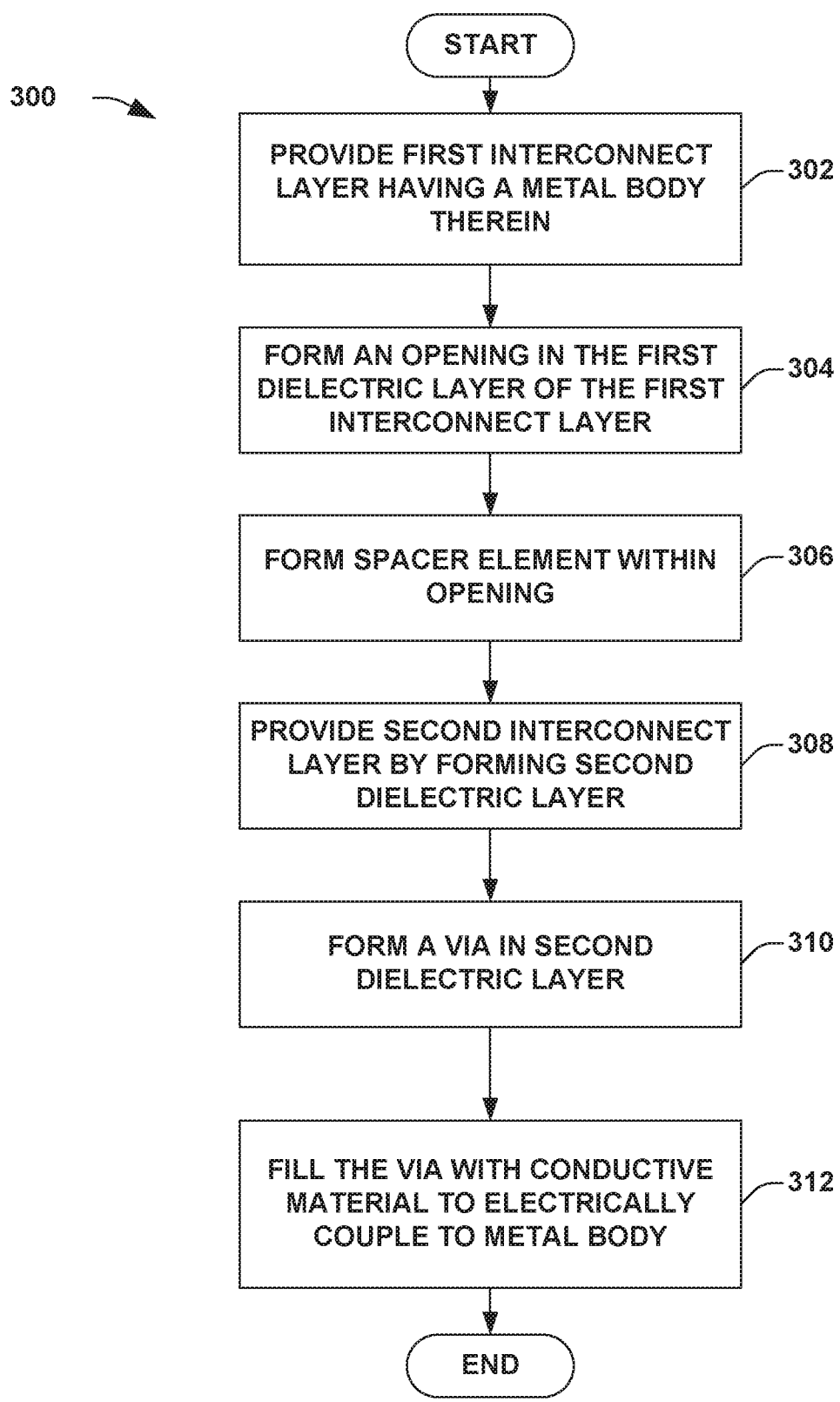
FIG. 3 illustrates a flow diagram of some embodiments of a method for the fabrication of a semiconductor device in accordance with the disclosure.

FIG. 3 illustrates a flow diagram of some embodiments of a method 300 for formation of a semiconductor structure according to an embodiment of the disclosure. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302 a first interconnect layer is provided. The first interconnect layer includes a dielectric material with a metal body, for example, a copper metal body, embedded therein. An opening is then formed in the first dielectric layer at 304.

At 306, a spacer element is formed in the opening. The spacer element has a sidewall contiguous with a sidewall of the metal body.

At 308, a second interconnect layer is provided overlying the first interconnect layer. Second interconnect layer includes a second dielectric material.

At 310, an opening is formed in the second dielectric layer by etching.

At 312, the opening is filled with a conductive material to electrically couple the conductive material to the metal body of the first interconnect layer. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to a semiconductor structure comprising a first interconnect layer including a first dielectric layer having a metal body therein. The metal body is defined by opposing sidewalls having first and second edges and a bottom surface. The semiconductor structure further includes a spacer element adjacent to the metal body, the spacer element having a sidewall contiguous with a sidewall of the metal body. The semiconductor structure further includes a second interconnect layer overlying the first interconnect layer and including a second dielectric material having at least one opening therein. The opening is filled with a conductive material which is electrically coupled to the metal body of the first interconnect layer.

The disclosure further relates to a method of forming a semiconductor structure comprising providing a first interconnect layer by forming a first dielectric layer having a metal body embedded therein, the metal body comprising a bottom surface and opposing sidewalls having first and second edges. The method further comprises forming a second opening in the first dielectric layer, the second opening adjacent to the metal body and having a sidewall contiguous with the metal body. The method further comprises forming a spacer element in the second opening. The method further comprises providing a second interconnect layer by forming a second dielectric layer and forming at least one dual damascene trench and via structure in the second dielectric layer, the via connecting to the metal body in the first interconnect layer, and filling the structure with a conductive material, the conductive material electrically coupled with the metal body of the first interconnect layer.

The disclosure further relates to a semiconductor structure that comprises a first dielectric layer overlying a semiconductor body, and a metal body residing in the first dielectric layer, the metal body having a first sidewall defining a first edge, and a second, opposing sidewall defining a second edge. The semiconductor structure further comprises a spacer element formed contiguous to the first edge of the metal body, which forms an interface thereat, and a second dielectric layer overlies the first dielectric layer and has a conductive damascene structure therein having a bottom surface that straddles the interface, wherein the conductive damascene structure makes conductive contact with the metal body.

What is claimed is:

1. A semiconductor structure, comprising:
   a semiconductor substrate;
   a first interconnect layer over the semiconductor substrate, the first interconnect layer comprising: a first dielectric material having a conductive body embedded therein, the conductive body comprising a first sidewall, a second sidewall, and a bottom surface, and a spacer element having a sidewall which contacts the first sidewall of the conductive body and which contacts the bottom surface of the conductive body; and
   a second interconnect layer overlying the first interconnect layer comprising a second dielectric material having at least one via therein, the at least one via filled with a conductive material which is electrically coupled to the conductive body of the first interconnect layer;
   wherein a height of the spacer element is greater than a height of the conductive body.

2. The semiconductor structure of claim 1, wherein material of the spacer element does not contact the second sidewall of the conductive body.

3. The semiconductor structure of claim 1, wherein material of the spacer element contacts the bottom surface of the conductive body at the first sidewall of the conductive body but does not extend directly under the bottom surface of the conductive body.

4. The semiconductor structure of claim 1, further comprising:
   a first barrier layer disposed along the second sidewall of the conductive body and along the bottom surface of the conductive body and terminating at the sidewall of the spacer element without extending along an upper portion of the first sidewall of the conductive body.

5. The semiconductor structure of claim 4, wherein the second interconnect layer further comprises a second barrier layer disposed between the second dielectric material and the conductive material.

6. The semiconductor structure of claim 5, wherein the first barrier layer or the second barrier layer comprises Ta, TaN, Co, W, TiSiN, or TaSiN.

7. The semiconductor structure of claim 1, wherein the at least one via in the second interconnect layer comprises a via which is misaligned relative to the conductive body such that a bottom protrusion of the via overlies the first sidewall of the conductive body and extends below a top surface of the spacer element.

8. The semiconductor structure of claim 1, wherein the conductive body comprises Al, W, Cu, or a Cu alloy, and the first dielectric material and the second dielectric material have the same composition as one another.

9. The semiconductor structure of claim 1, wherein the conductive body comprises copper.

10. A semiconductor structure, comprising:
a semiconductor substrate;
a first interconnect layer over the semiconductor substrate, the first interconnect layer comprising a first dielectric material having a conductive body embedded therein, the conductive body comprising a first sidewall, a second sidewall, and a bottom surface, and a spacer element having a sidewall contacting the first sidewall of the conductive body;
a second interconnect layer overlying the first interconnect layer comprising a second dielectric material having at least one via therein, the at least one via filled with a conductive material which is electrically coupled to the conductive body of the first interconnect layer;
wherein the at least one via has a lower conductive protrusion which is arranged directly over the first sidewall of the conductive body and which extends below an upper surface of the conductive body and below an upper surface of the spacer element; and
a first barrier layer disposed along the second sidewall of the conductive body and along the bottom surface of the conductive body and terminating at the sidewall of the spacer element without extending along the first sidewall of the conductive body.

11. The semiconductor structure of claim 10, wherein the sidewall of the spacer element contacts the bottom surface of the conductive body.

12. The semiconductor structure of claim 10, wherein material of the spacer element does not contact the second sidewall of the conductive body.

13. The semiconductor structure of claim 10, wherein material of the spacer element contacts the bottom surface of the conductive body at the first sidewall of the conductive body but does not extend directly under the bottom surface of the conductive body.

14. The semiconductor structure of claim 10, wherein the conductive body comprises copper.

15. A semiconductor structure, comprising:
a semiconductor substrate;
a first interconnect layer over the semiconductor substrate, the first interconnect layer comprising a first dielectric material having a metal body embedded therein, the metal body comprising a first sidewall, a second sidewall, and a bottom surface, and a spacer element having a sidewall in direct contact with the first sidewall of the metal body; and
a first barrier layer disposed along the second sidewall of the metal body and along the bottom surface of the metal body and terminating at the sidewall of the spacer element without extending along the first sidewall of the metal body.

16. The semiconductor structure of claim 15, further comprising:
a second interconnect layer over the first interconnect layer, the second interconnect layer comprising second dielectric material and a via embedded in the second dielectric material, wherein the via is misaligned relative to the metal body and has a lower via protrusion which is arranged over the first sidewall of the metal body and which extends below a top surface of the spacer element.

17. The semiconductor structure of claim 16 wherein a height of the spacer element is greater than or substantially equal to a height of the metal body.

18. The semiconductor structure of claim 16, wherein the via has a via central axis and the metal body has a metal body central axis, and wherein the via central axis is laterally offset from the metal body central axis.

19. The semiconductor structure of claim 16, wherein the lower via protrusion is arranged asymmetrically about the metal body and laterally separates an uppermost portion of the spacer element from an uppermost portion of the metal body.

20. The semiconductor structure of claim 15, wherein the spacer element is disposed alongside the first sidewall of the metal body without extending under a lower surface of the metal body and without extending alongside the second sidewall of the metal body.

\* \* \* \* \*